United States Patent
Lee et al.

(10) Patent No.: US 9,525,076 B2
(45) Date of Patent: Dec. 20, 2016

(54) MEMORY DEVICE USING GRAPHENE AS CHARGE-TRAP LAYER AND METHOD OF OPERATING THE SAME

(71) Applicant: Samsung Electronics Co., Ltd., Suwon-Si, Gyeonggi-Do (KR)

(72) Inventors: Jae-ho Lee, Seoul (KR); Hyun-jong Chung, Hwaseong-si (KR); Seong-jun Park, Seoul (KR); Kyung-eun Byun, Uijeongbu-si (KR); David Seo, Yongin-si (KR); Hyun-jae Song, Hwaseong-si (KR); Jin-seong Heo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 36 days.

(21) Appl. No.: 13/960,256

(22) Filed: Aug. 6, 2013

(65) Prior Publication Data

US 2014/0231820 A1 Aug. 21, 2014

(30) Foreign Application Priority Data

Feb. 15, 2013 (KR) .................. 10-2013-0016595

(51) Int. Cl.
*H01L 29/792* (2006.01)
*B82Y 10/00* (2011.01)
(Continued)

(52) U.S. Cl.
CPC ............ *H01L 29/792* (2013.01); *B82Y 10/00* (2013.01); *G11C 11/40* (2013.01);
(Continued)

(58) Field of Classification Search
CPC .......... H01L 29/1606; H01L 29/66015; H01L 27/24; H01L 45/04; H01L 29/792; H01L 29/7781; H01L 29/47; H01L 29/788; H01L 21/28273; H01L 51/0512; Y10S 977/938; Y10S 977/734; B82Y 10/00; G11C 16/0466; G11C 11/40
See application file for complete search history.

(56) References Cited

U.S. PATENT DOCUMENTS 3,543,052 A 11/1970 Kahng
6,208,000 B1 * 3/2001 Tanamoto et al. ............ 257/402
(Continued)

FOREIGN PATENT DOCUMENTS

KR 2009-0010758 A 1/2009
KR 1020090010758 * 1/2009 ......... H01L 21/8247
(Continued)

OTHER PUBLICATIONS

Machine translation of KR1020090010758, translated Feb. 1, 2016.*
(Continued)

*Primary Examiner* — Zandra Smith
*Assistant Examiner* — Lauren R Bell

(57) ABSTRACT

A graphene memory includes a source and a drain spaced apart from each other on a conductive semiconductor substrate, a graphene layer contacting the conductive semiconductor substrate and spaced apart from and between the source and the drain, and a gate electrode on the graphene layer. A Schottky barrier is formed between the conductive semiconductor substrate and the graphene layer such that the graphene layer is used as a charge-trap layer for storing charges.

6 Claims, 5 Drawing Sheets

(51) Int. Cl.
| | |
|---|---|
| *H01L 21/28* | (2006.01) |
| *H01L 29/47* | (2006.01) |
| *H01L 29/788* | (2006.01) |
| *H01L 29/16* | (2006.01) |
| *G11C 11/40* | (2006.01) |
| *H01L 29/778* | (2006.01) |
| *G11C 16/04* | (2006.01) |
| *H01L 51/05* | (2006.01) |

(52) U.S. Cl.
CPC .... *G11C 16/0466* (2013.01); *H01L 21/28273* (2013.01); *H01L 29/1606* (2013.01); *H01L 29/47* (2013.01); *H01L 29/7781* (2013.01); *H01L 29/788* (2013.01); *H01L 51/0512* (2013.01); *Y10S 977/734* (2013.01); *Y10S 977/938* (2013.01)

(56) References Cited

U.S. PATENT DOCUMENTS

| | | | |
|---|---|---|---|
| 6,720,613 B1* | 4/2004 | Chang | H01L 21/28273 257/314 |
| 2004/0179391 A1 | 9/2004 | Bhattacharyya | |
| 2005/0099839 A1 | 5/2005 | Bhattacharyya | |
| 2009/0101964 A1* | 4/2009 | Choi et al. | 257/324 |
| 2010/0025660 A1 | 2/2010 | Jain et al. | |
| 2013/0001516 A1* | 1/2013 | Hebard et al. | 257/29 |
| 2013/0277644 A1 | 10/2013 | Seo et al. | |
| 2014/0117313 A1 | 5/2014 | Lee et al. | |

FOREIGN PATENT DOCUMENTS

| | | |
|---|---|---|
| KR | 2011-0081683 A | 7/2011 |
| KR | 2012-0015290 A | 2/2012 |
| KR | 2012-0033722 A | 4/2012 |
| KR | 10-2013-0022854 A | 3/2013 |
| KR | 2013-0022854 A | 3/2013 |

OTHER PUBLICATIONS

A. Hong et al. "Graphene Flash Memory"; American Chemical Society Nano, pp. 7812-7817; Oct. 2011; XP055125246.

R. Yang et al. "Isolated nanographene crystals for nano-floating gate in charge trapping memory"; Scientific Reports, vol. 3, pp. 2126-2126; Jan. 2013; XP055125247.

A Misra et al. "Multilayer Graphene as Charge Storage Layer in Floating Gate Flash Memory"; Institute of Electrical and Electronics Engineers; Memory Workshop (IMW), 2012 4th IEEE International, pp. 1-4; May 2012; XP055125221.

European Search Report for corresponding European application No. 13 188 132.8 dated Jul. 7, 2014.

* cited by examiner

MEMORY DEVICE USING GRAPHENE AS CHARGE-TRAP LAYER AND METHOD OF OPERATING THE SAME

CROSS-REFERENCE TO RELATED APPLICATIONS

This application claims the benefit of Korean Patent Application No. 10-2013-0016595, filed on Feb. 15, 2013, in the Korean Intellectual Property Office, the disclosure of which is incorporated herein in its entirety by reference.

BACKGROUND

1. Field

Example embodiments relate to non-volatile memory devices using graphene as a charge-trap layer by using a Schottky barrier between the graphene and a semiconductor substrate.

2. Description of the Related Art

Graphene has a 2-dimensional hexagonal carbon structure and research thereon is actively conducted as a material for replacing a semiconductor. In particular, graphene is a zero gap semiconductor, has metallic characteristics, and contacts metal to form a Schottky barrier therebetween.

As a non-volatile memory device, flash memory stores charges in a floating gate disposed between a control electrode and a channel. In order to prevent or inhibit leakage of charges at a floating gate, the floating gate is surrounded by an insulating layer.

In order to trap charges from a channel to a floating gate, the charges should pass through an insulating layer (tunneling oxide) therebetween, and thus a higher operation voltage is required.

As a charge-trap non-volatile memory device, a silicon-oxide-nitride-oxide-silicon (SONOS) memory device may have a lower operation voltage. A SONOS memory device has a structure in which a tunneling layer formed of silicon oxide, a charge-trap layer formed of silicon nitride, a blocking layer formed of silicon oxide, and a gate electrode are sequentially stacked on a semiconductor channel.

SUMMARY

Example embodiments provide non-volatile memory devices using graphene as a charge-trap layer by using a Schottky barrier between the graphene and a semiconductor, instead of a typical tunneling oxide.

Additional aspects will be set forth in part in the description which follows and, in part, will be apparent from the description, or may be learned by practice of example embodiments.

According to example embodiments, a graphene memory includes a conductive semiconductor substrate; a source and a drain spaced apart from each other on the conductive semiconductor substrate, a graphene layer contacting the conductive semiconductor substrate and spaced apart from and between the source and the drain, and a gate electrode on the graphene layer, wherein a Schottky barrier is formed between the conductive semiconductor substrate and the graphene layer such that the graphene layer is used as a charge-trap layer for storing charges.

The conductive semiconductor substrate may include one of silicon, germanium, silicon-germanium, and a Group III-V semiconductor. The graphene layer may include one to four layers of graphene. The graphene layer may include at least one of a hole and a slit.

The graphene memory may further include a conductive layer contacting the graphene layer and facing the conductive semiconductor substrate with respect to the graphene layer. The conductive layer may include one of metal and polysilicon. Each of the graphene layer and the conductive layer may include one of holes and slits. The one of holes and slits of the graphene layer may be connected to the one of holes slits of the conductive layer.

A size of the Schottky barrier may vary according to a voltage applied to the gate electrode. From a top view, the gate electrode may cover the graphene layer and may face the conductive semiconductor substrate exposed by the graphene layer.

According to example embodiments, a method of operating the above graphene memory includes removing storage charges from the graphene layer by applying a drain voltage to the drain and applying a first gate voltage to the gate electrode, storing the storage charges in the graphene layer by applying a second gate voltage to the gate electrode, the second gate voltage having an opposite polarity to the first gate voltage, and applying a third gate voltage to the gate electrode, the third gate voltage having the same polarity as the second gate voltage and measuring a drain current flowing through the drain.

The storage charges may be stored by doping the graphene layer with the storage charges while increasing the Schottky barrier.

The storage charges may be removed by doping the graphene layer with charges having an opposite polarity to the storage charges while reducing the Schottky barrier. The third gate voltage may be lower than the second gate voltage.

According to example embodiments, a graphene memory includes a graphene layer contacting a substrate to form a Schottky barrier therebetween.

The substrate may include one of silicon, germanium, silicon-germanium, and a Group II-V semiconductor. The graphene layer may include one to four layers of graphene. The graphene layer may include at least one of a hole and a slit.

The graphene memory may further include a conductive layer contacting the graphene layer and facing the substrate with respect to the graphene layer. The conductive layer may include one of metal and polysilicon. Each of the graphene layer and the conductive layer may include one of holes and slits. The one of the holes and the slits of the graphene layer may be connected to the one of the holes and the slits of the conductive layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
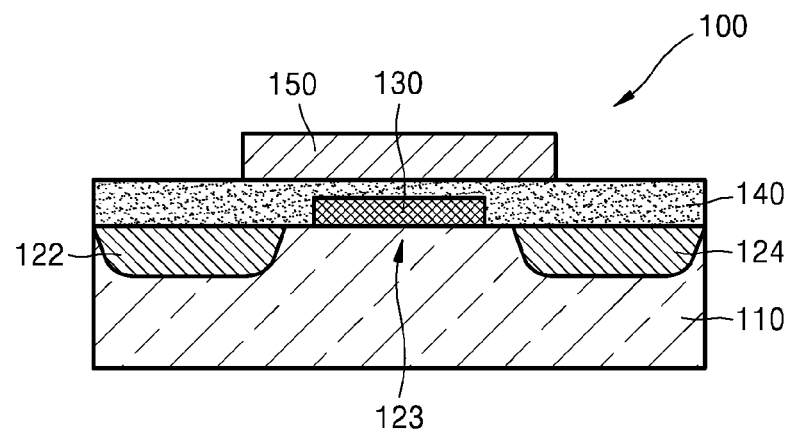
FIG. 1 is a cross-sectional view of a memory device using graphene as a charge-trap layer, according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a memory device 100 using graphene as a charge-trap layer, according to example embodiments. embodiment.

Referring to FIG. 1, a source region 122 and a drain region 124 which are impurity regions spaced apart from each other may be formed on a substrate 110. The substrate may be formed of a semiconductor. The memory device 100 may include a graphene layer 130 as a charge-trap layer between the source region 122 and the drain region 124. An insulating layer 140 and a gate electrode 150 are sequentially stacked on the graphene layer 130.

The substrate 110 may be formed of silicon, germanium, silicon-germanium, or a Group III-V semiconductor. It is assumed in the following description that the substrate 110 is formed of silicon. The substrate 110 is doped with a p-type impurity or an n-type impurity.

The source region 122 and the drain region 124 may be regions doped with an impurity having an opposite polarity to the substrate 110. For example, if the substrate 110 is doped with a p-type impurity, the source region 122 and the drain region 124 may be doped with an n-type impurity.

The graphene layer 130 may be formed to be spaced apart from the source region 122 and the drain region 124 and to contact the substrate 110. That is, the graphene layer 130 may be formed on a channel region 123 between the source region 122 and the drain region 124. The graphene layer 130 may be a layer for trapping electrons or holes from the channel region 123.

A Schottky barrier may be formed between the graphene layer 130 and the substrate 110 due to the contact therebetween. According to example embodiments, a typical tunnel layer does not exist between the graphene layer 130 and the substrate 110 and the Schottky barrier functions as the tunnel layer.

The graphene layer 130 may include one through four layers of graphene. Like metal, the graphene layer 130 has relatively high charge mobility. Accordingly, if the graphene layer 130 is used as a charge-trap layer, trapped charges may be uniformly distributed and thus improved charge storage characteristics may be achieved. Also, when the graphene layer 130 is a multiple layer of graphene having improved interlayer insulating characteristics, as long as a gate voltage is not changed, trapped charges may hardly leak and thus improved retention characteristics may be achieved.

The graphene layer 130 may have a width of about 20 nm to 150 nm.

The insulating layer 140 may be formed of, for example, silicon oxide ($SiO_2$), alumina ($Al_2O_3$), or hafnium oxide ($HfO_2$).

The gate electrode 150 may be formed of, for example, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

Figure 2:
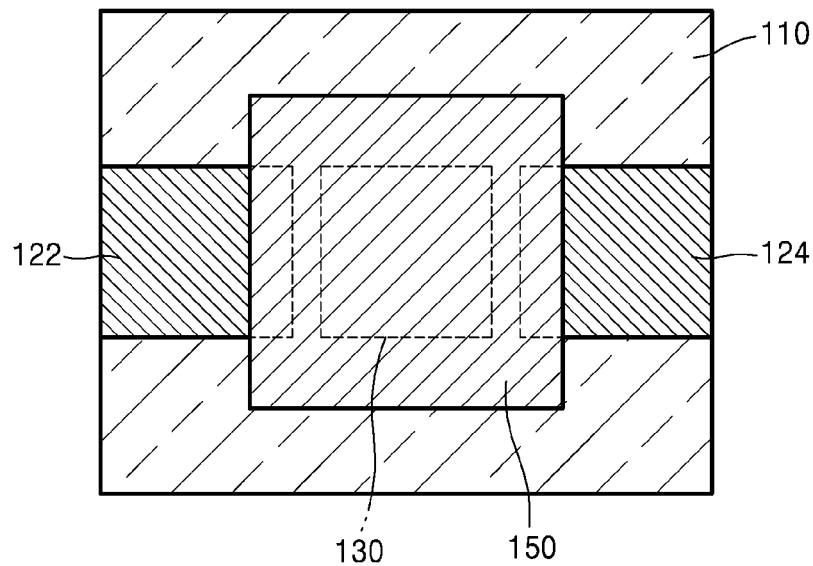
FIG. 2 is a plan view of the memory device illustrated in FIG. 1.

FIG. 2 is a plan view of the memory device 100 illustrated in FIG. 1. For convenience's sake, the insulating layer 140 is not illustrated.

Referring to FIG. 2, the gate electrode 150 is formed above the graphene layer 130 to be wider than the graphene layer 130 and thus to cover the graphene layer 130. An electric field effect from the gate electrode 150 on the substrate 110 may have reduced due to the graphene layer 130. Because the gate electrode 150 is formed to face the substrate 110 exposed by the graphene layer 130, an electric field from the gate electrode 150 is applied to the substrate 110.

A method of operating the memory device 100 will now be described in detail with reference to FIGS. 3A through 3H.

FIGS. 3A through 3G are band diagrams between the substrate 110 and the graphene layer 130 in order to describe the function of the memory device 100 illustrated in FIG. 1. In the following description, the substrate 110 is a p-type silicon substrate and that the source region 122 and the drain region 124 are n+ doped regions. In this case, storage charges stored in the graphene layer 130 are electrons, and charges opposite to the storage charges are holes. A state before charges are charged in the graphene layer 130 (erase state) is referred to as state "0", and a state when charges are charged in the graphene layer 130 (program state) is referred to as state "1".

Figure 3A:
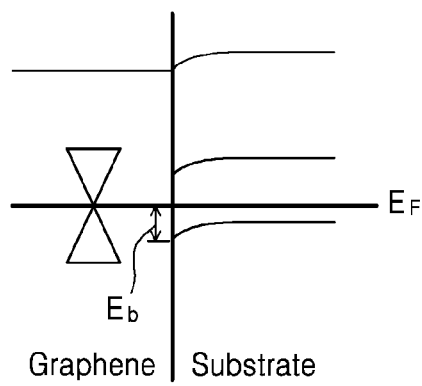
FIGS. 3A through 3G are band diagrams between a substrate and a graphene layer in order to describe the function of the memory device illustrated in FIG. 1.

Referring to FIG. 3A, an energy band in the channel region 123 may be represented as a band diagram between the p-type substrate 110 and the graphene layer 130. Due to a contact between the substrate 110 and the graphene layer 130, an energy band is formed in correspondence with work functions of the graphene layer 130 and the substrate 110. A Schottky barrier $E_b$ is formed between the substrate 110 and the graphene layer 130. The Schottky barrier $E_b$ restricts migration of electrons between the substrate 110 and the graphene layer 130. $E_F$ denotes a Fermi level.

When a gate voltage is not applied, electrons hardly flow through the channel region 123.

FIG. 3A shows an initial state in which a voltage is not applied to the memory device 100.

Figure 3B:
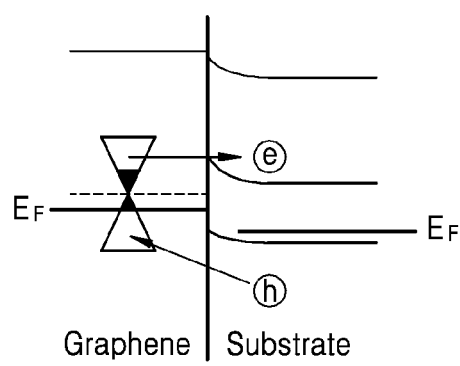

Referring to FIG. 3B, if a first gate voltage (negative voltage) is applied to the gate electrode 150 and a positive voltage is applied to the substrate 110, in an accumulation mode, the graphene layer 130 is hole-doped and all electrons in the graphene layer 130 are removed.

In an erase operation, the size of a Schottky barrier is reduced and the graphene layer 130 is doped with holes. Also, charges (electrons) stored in the graphene layer 130 are tunneled to the substrate 110 and thus are removed.

Figure 3C:
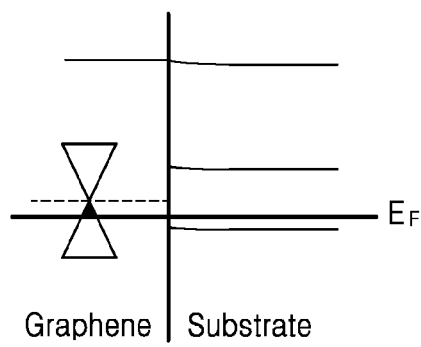

FIG. 3C is a band diagram of a state in which all voltages are removed after the erase operation of FIG. 3B is completed (state "0").

Figure 3D:
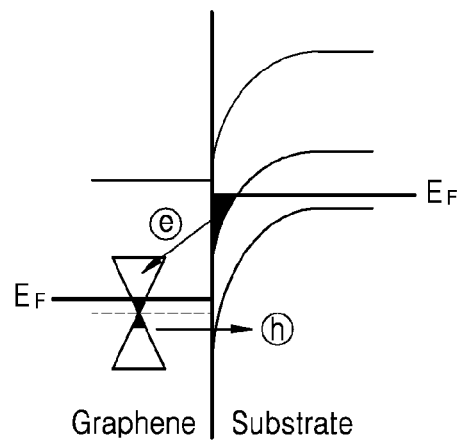

Referring to FIG. 3D, if a second gate voltage (positive voltage) equal to or greater than a threshold voltage of the erase state is applied to the gate electrode 150 and a predetermined or given drain voltage is applied to the drain region 124, the channel region 123 is changed to an inversion state such that the graphene layer 130 is doped with electrons and electrons of the channel region 123 move to the graphene layer 130. In a program operation, a Schottky barrier $E_b$ (see FIG. 3E) is increased and the graphene layer 130 is changed from a hole-doped state to an electron-doped state.

Figure 3E:
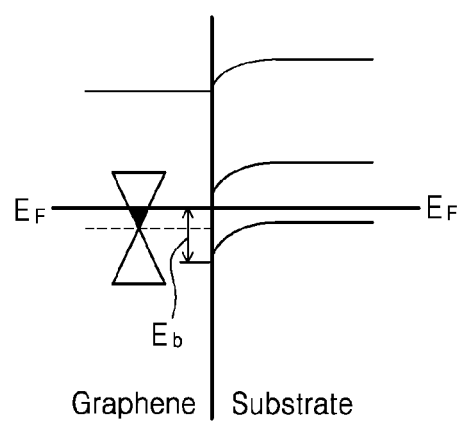

FIG. 3E is a band diagram of a state in which all voltages are removed after the program operation of FIG. 3D is completed (state "1").

If a predetermined or given third gate voltage (positive voltage) is applied to the memory device 100, a drain current may be read. If the drain current is relatively high, information "1" is recorded in the memory device 100. If the drain current is relatively low, information "0" is recorded in the memory device 100. The drain current may be determined as being relatively high or relatively low in comparison to a preset reference current.

Figure 3F:
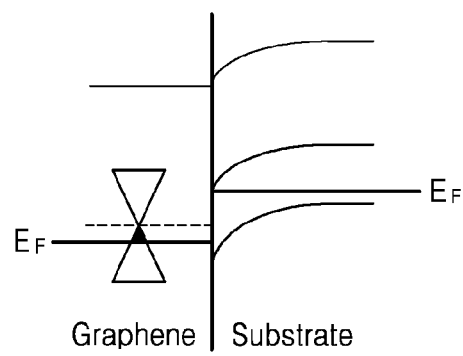
Figure 3G:
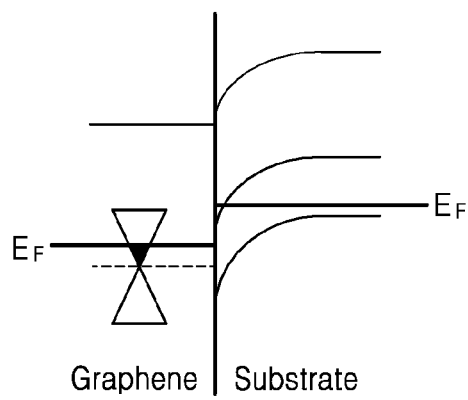

FIGS. 3F and 3G are diagrams for describing a read operation.

Referring to FIG. 3F, if the third gate voltage is applied to the gate electrode 150 and the predetermined or given drain voltage is applied to the drain region 124 in an erase state, electrons do not move from the source region 122 to the drain region 124.

Otherwise, referring to FIG. 3G, if the third gate voltage is applied to the gate electrode 150 and the predetermined or given drain voltage is applied to the drain region 124 in a program state, electrons move from the source region 122 to the drain region 124.

The third gate voltage has the same polarity as the second gate voltage and may have a smaller absolute value than the second gate voltage.

Figure 3H:
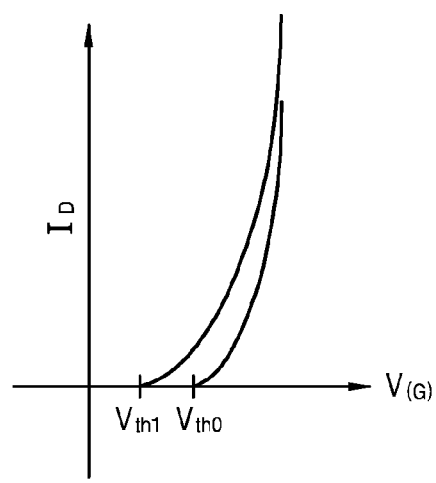
FIG. 3H is a current-voltage (I-V) characteristics graph showing threshold voltages in program and erase conditions.

FIG. 3H shows a threshold voltage difference between an erase state and a program state. The third gate voltage is located between a threshold voltage $V_{th0}$ of the erase state and a threshold voltage $V_{th1}$ of the program state.

A case when the substrate 110 of the memory device 100 is doped with a p-type impurity and the source region 122 and the drain region 124 are doped with an n-type impurity is described above with reference to FIGS. 3A through 3H. If the substrate 110 of the memory device 100 is doped with an n-type impurity and the source region 122 and the drain region 124 are doped with a p-type impurity, except that charges stored in the graphene layer 130 are holes and that the polarity of an applied gate voltage differs, the other operation is well known from the above descriptions and the operation of the memory device 100 is not repeatedly provided here.

In the memory device 100 using graphene, according to example embodiments, charges may be uniformly distributed in the graphene layer 130 that is a charge-trap layer and leakage of trapped charges may be suppressed by a Schottky barrier so as to achieve improved retention characteristics.

Figure 4:
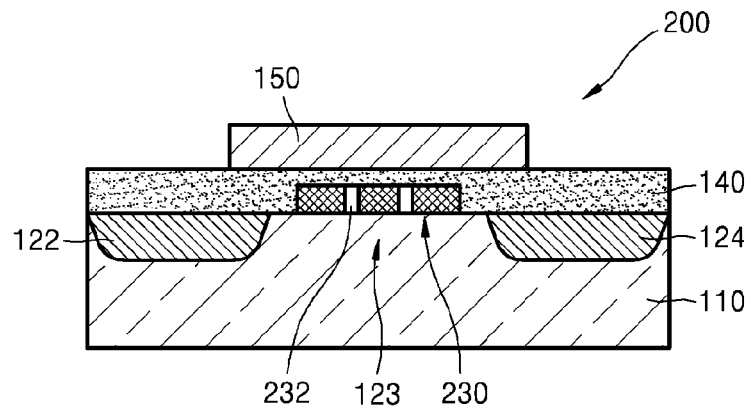
FIG. 4 is a cross-sectional view of a memory device using graphene as a charge-trap layer, according to example embodiments.

FIG. 4 is a cross-sectional view of a memory device 200 using graphene as a charge-trap layer, according to example embodiments. In FIGS. 1 and 4, like reference numerals denote like elements and thus detailed descriptions thereof are not repeatedly provided here.

Referring to FIG. 4, a plurality of holes 232 are formed in a graphene layer 230. The holes 232 may be slits extending in one direction.

Other elements are the same as those of FIG. 1 and thus detailed descriptions thereof are not repeatedly provided here.

Because an electric field from the gate electrode 150 more influences the substrate 110 under the graphene layer 230 through the holes 232, the memory device 200 including the graphene layer 230 may have a relatively low operation voltage.

Although the graphene layer 230 having the holes 232 is illustrated in FIG. 4, the present disclosure is not limited thereto. For example, a plurality of graphene layers may be formed on the substrate 110 to be spaced apart from each other. In this case, a slit may be formed between adjacent graphene layers.

The function of the memory device 200 illustrated in FIG. 4 is substantially the same as the function of the memory device 100 illustrated in FIG. 1 and thus a detailed description thereof is not repeatedly provided here.

Figure 5:
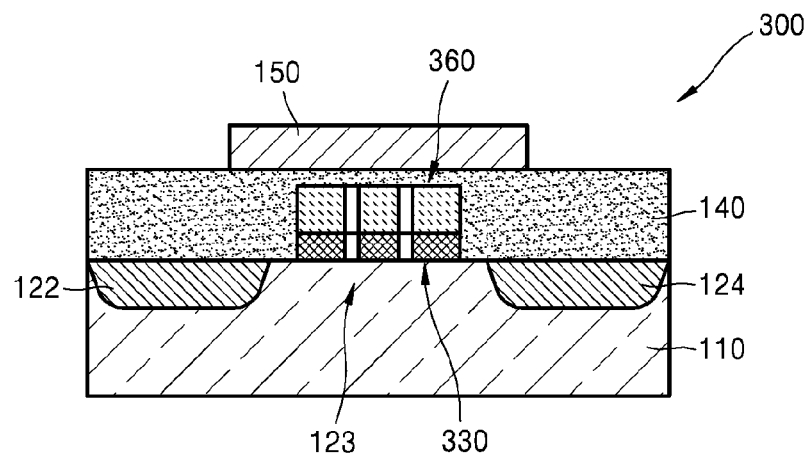
FIG. 5 is a cross-sectional view of a memory device using graphene as a charge-trap layer, according to example embodiments.
Figure 6:
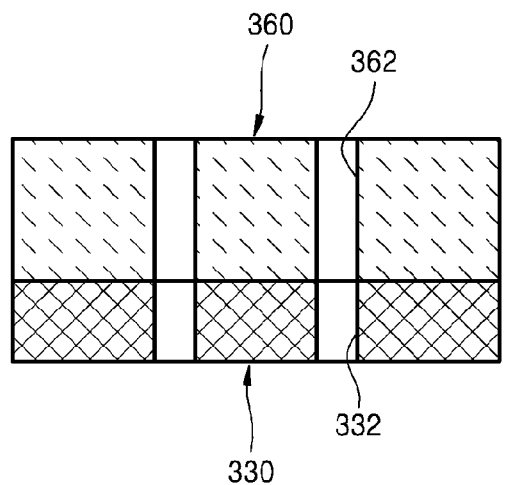
FIG. 6 is a magnified view of a portion of FIG. 5.

FIG. 5 is a cross-sectional view of a memory device 300 using graphene as a charge-trap layer, according to example embodiments. FIG. 6 is a magnified view of a portion of FIG. 5. In FIGS. 1, 5, and 6, like reference numerals denote like elements and thus detailed descriptions thereof are not repeatedly provided here.

Referring to FIGS. 5 and 6, a conductive layer 360 contacting a graphene layer 330 and facing the substrate 110 with respect to the graphene layer 330 is formed on the graphene layer 330. The conductive layer 360 provides a charge storing space for storing charges that are moved from the graphene layer 330.

The conductive layer 360 may be formed of polysilicon or general metal, for example, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

A plurality of holes 332 may be formed in the graphene layer 330. The holes 332 may be slits extending in one direction.

A plurality of holes 362 are formed in the conductive layer 360. The holes 362 may be slits extending in one direction.

The holes 362 of the conductive layer 360 and the holes 332 of the graphene layer 330 may be connected to each other.

Because an electric field from the gate electrode 150 more influences the substrate 110 under the graphene layer 330 through the holes 332 and 362, the memory device 300 may have a relatively low operation voltage.

Other elements are the same as those of FIG. 1 and thus detailed descriptions thereof are not repeatedly provided here.

The function of the memory device 300 illustrated in FIG. 5 is well known based on the function of the memory device 100 illustrated in FIG. 1 and thus a detailed description thereof is not repeatedly provided here.

According to example embodiments, a graphene layer may be used as a charge-trap layer by using a Schottky barrier between a substrate and the graphene layer contacting the substrate, instead of a tunnel layer.

If the graphene layer having relatively high charge mobility is used as a charge-trap layer, trapped charges may be uniformly distributed and thus improved charge storage characteristics may be achieved.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A graphene memory comprising:
a conductive semiconductor substrate;
a source and a drain spaced apart from each other on a surface of the conductive semiconductor substrate;
a graphene layer contacting the conductive semiconductor substrate and spaced apart from and between the source and the drain when viewed from a plan view, the graphene layer being flat;
a conductive layer directly on the graphene layer, the conductive layer facing the conductive semiconductor substrate with the graphene layer therebetween; and
a gate electrode above the conductive layer,
wherein a Schottky barrier is formed between the conductive semiconductor substrate and the graphene layer such that the graphene layer is used as a charge-trap layer for storing charges,
wherein the gate electrode covers the graphene layer and overlaps a portion of the conductive semiconductor substrate exposed by a periphery of the graphene layer when viewed from the plan view,
wherein the graphene layer includes one of at least one hole and at least one slit passing through the graphene layer, and
wherein the conductive layer includes one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

2. The graphene memory of claim 1, wherein the conductive semiconductor substrate includes one of silicon, germanium, silicon-germanium, and a Group III-V semiconductor.

3. The graphene memory of claim 1, wherein the graphene layer includes one to four layers of graphene.

4. The graphene memory of claim 1, wherein the conductive layer includes one of at least one hole and at least one slit passing through the conductive layer.

5. The graphene memory of claim 4, wherein the one of at least one hole and at least one slit of the graphene layer is connected to a corresponding one of the at least one hole and the at least one slit of the conductive layer.

6. The graphene memory of claim 1, wherein a size of the Schottky barrier varies according to a voltage applied to the gate electrode.

* * * * *